US012232278B2

United States Patent
Tsorng et al.

(10) Patent No.: US 12,232,278 B2
(45) Date of Patent: Feb. 18, 2025

(54) ROTATABLE BRACKET MODULE

(71) Applicant: Quanta Computer Inc., Taoyuan (TW)

(72) Inventors: Yaw-Tzorng Tsorng, Taoyuan (TW); Tung-Hsien Wu, Taoyuan (TW); Yu-Ying Tseng, Taoyuan (TW); Hsiang-Pu Ni, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 218 days.

(21) Appl. No.: 18/057,624

(22) Filed: Nov. 21, 2022

(65) Prior Publication Data

US 2024/0172374 A1 May 23, 2024

(51) Int. Cl.
*H05K 5/00* (2006.01)
*H05K 5/02* (2006.01)

(52) U.S. Cl.
CPC ......... *H05K 5/0069* (2013.01); *H05K 5/0226* (2013.01)

(58) Field of Classification Search
CPC ...... H05K 7/1489; H05K 5/0221; H05K 7/14; H05K 5/03; H05K 5/0226; G06F 1/187
See application file for complete search history.

(56) References Cited

U.S. PATENT DOCUMENTS

| 5,495,389 | A | 2/1996 | Dewitt et al. |
| 6,396,703 | B1 | 5/2002 | White |
| 7,070,431 | B1 | 7/2006 | White |
| 9,826,658 | B1* | 11/2017 | Mao ........................ G06F 1/183 |
| 12,016,148 | B2 | 6/2024 | Tsorng et al. |
| 2005/0122703 | A1 | 6/2005 | Fan et al. |
| 2005/0152122 | A1 | 7/2005 | Fan et al. |
| 2014/0049901 | A1 | 2/2014 | Zhu |
| 2014/0183317 | A1 | 7/2014 | Li |
| 2016/0135322 | A1* | 5/2016 | Chen .................. H05K 7/20727 361/679.46 |
| 2021/0365084 | A1 | 11/2021 | Chang et al. |
| 2022/0057848 | A1 | 2/2022 | Chang et al. |
| 2022/0272859 | A1 | 8/2022 | Zhang |

* cited by examiner

*Primary Examiner* — James Wu
*Assistant Examiner* — Dakota M Talbert
(74) *Attorney, Agent, or Firm* — NIXON PEABODY LLP

(57) ABSTRACT

A bracket module and a computing device including the bracket module are disclosed. The bracket module includes a housing structure. The housing structure includes a plurality of slots. Each slot is configured to accept a device inserted therein. The housing structure is configured for attachment in a chassis of the computing device. The bracket module further includes a tray structure. The tray structure includes a fixed end connected to the housing structure and a free end opposite from the fixed end. The tray structure is configured to rotate relative to the housing structure about the fixed end. The bracket module further includes at least one fastener configured to engage the tray structure with the housing structure in an open position.

20 Claims, 16 Drawing Sheets

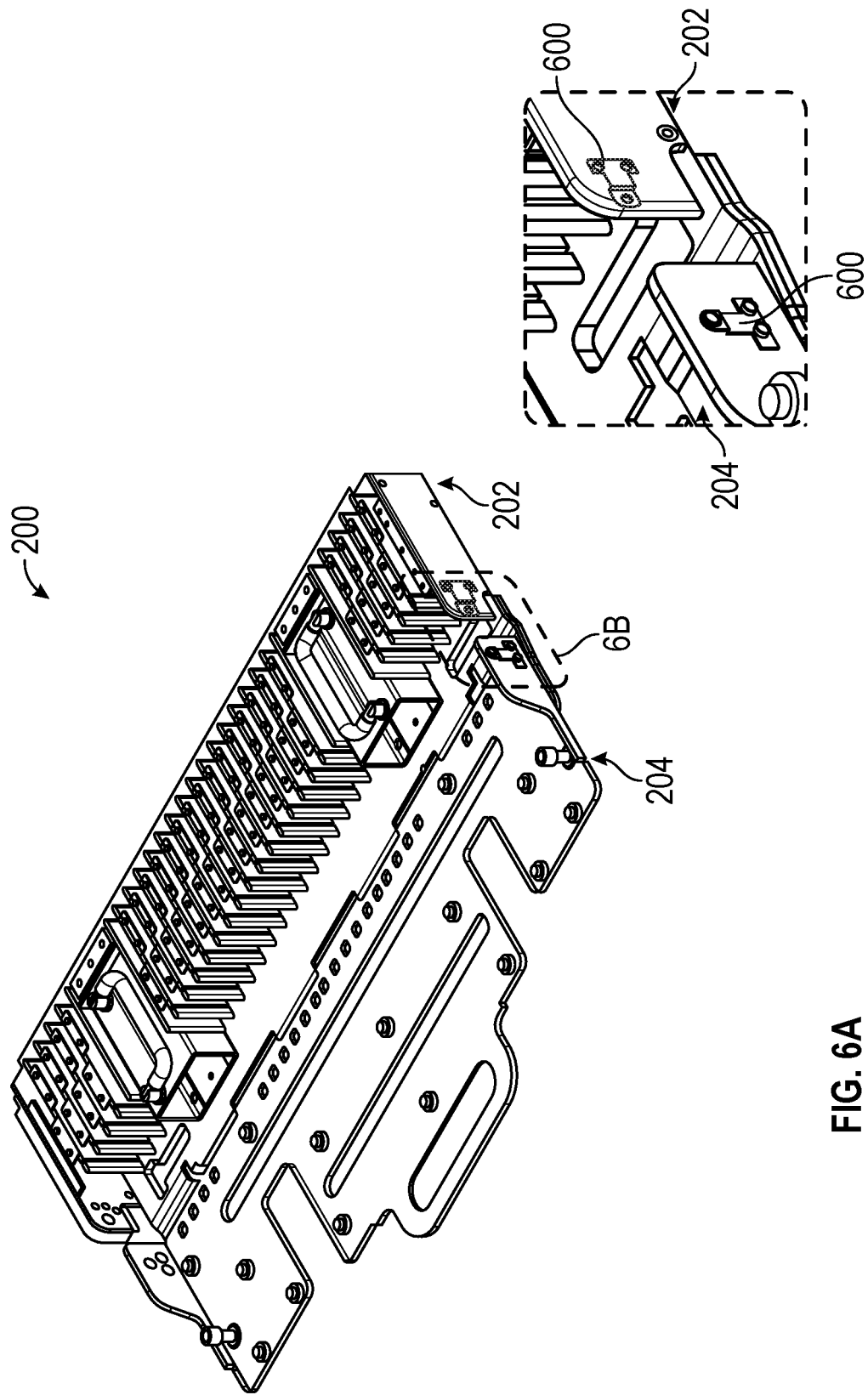

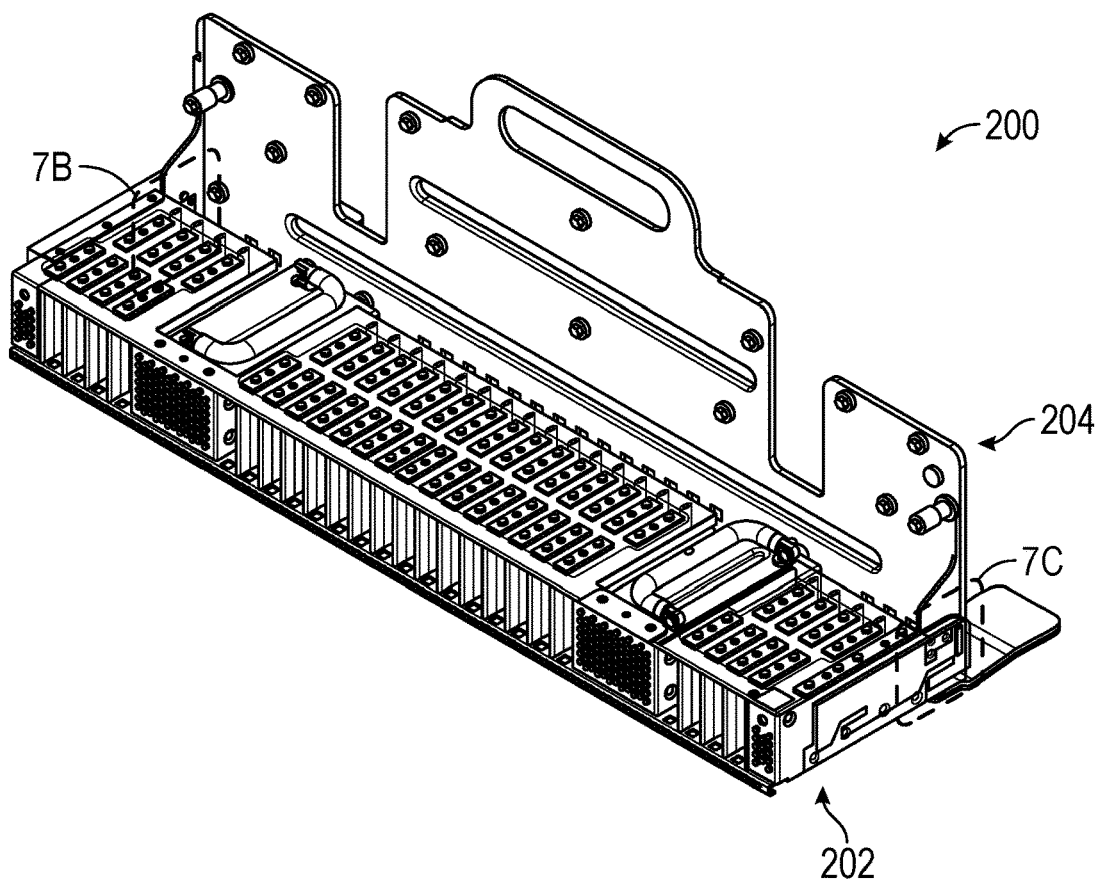
FIG. 7A
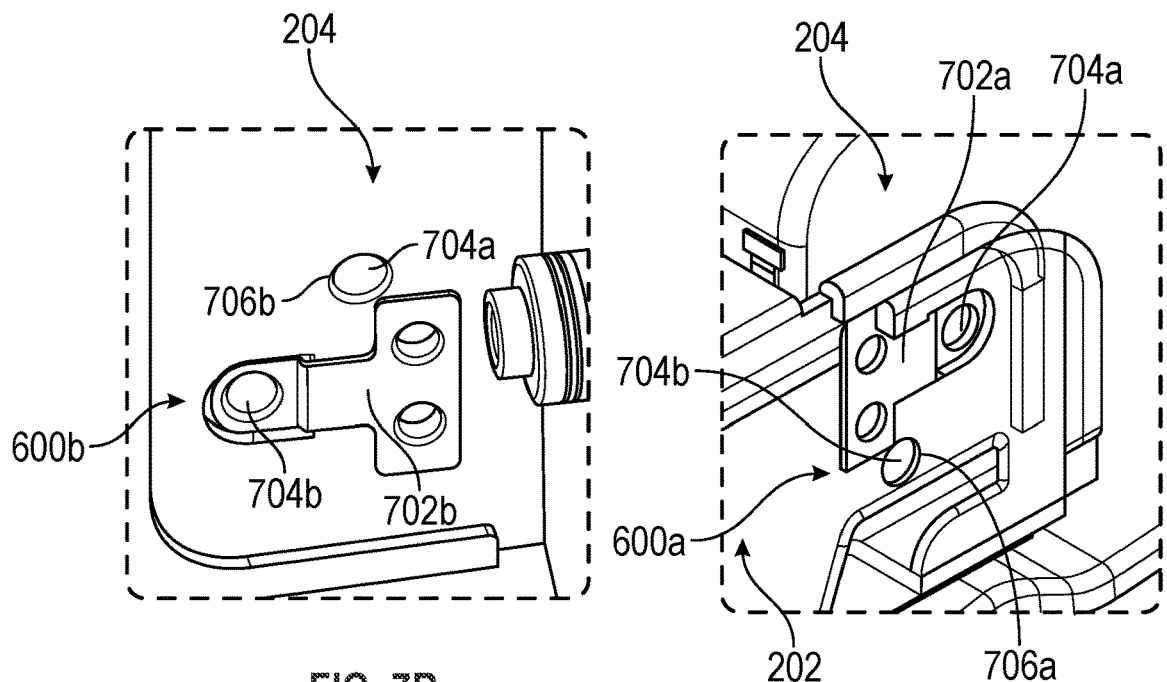
FIG. 7B
FIG. 7C

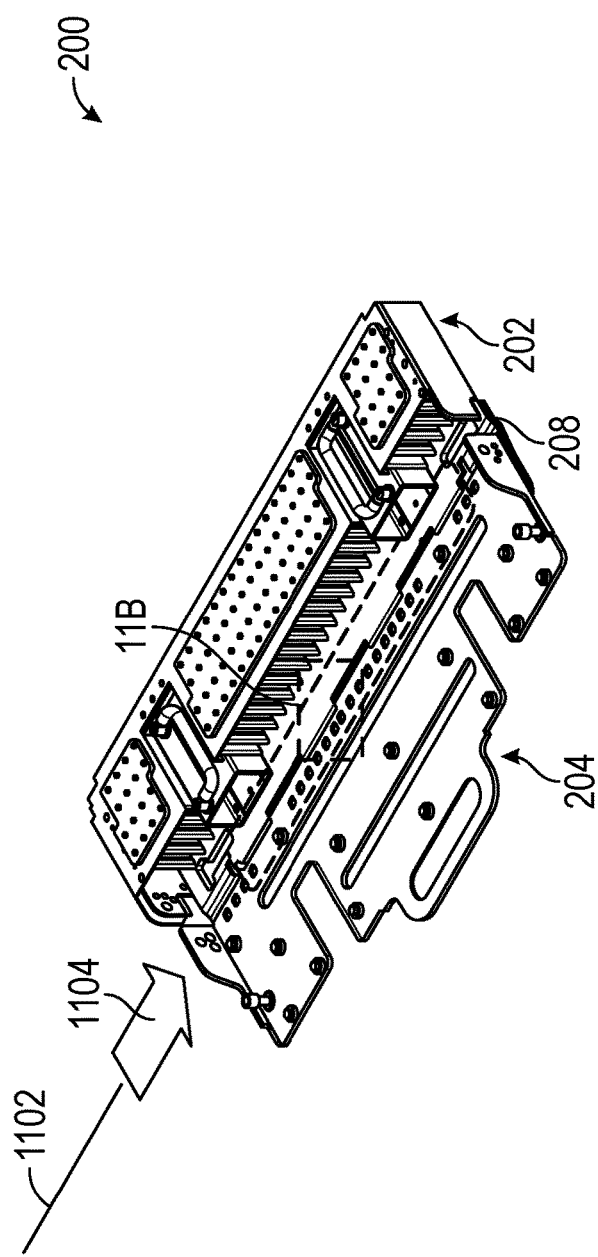
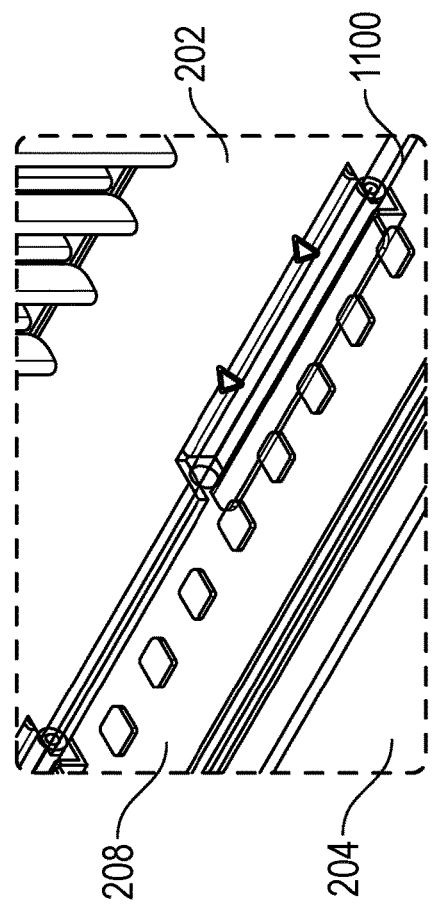
FIG. 11A
FIG. 11B

ROTATABLE BRACKET MODULE

FIELD OF THE INVENTION

The present invention relates generally to a bracket module and, more specifically, to a bracket module within a chassis that provides access to below the bracket module.

BACKGROUND OF THE INVENTION

Computing devices, and particularly server computer systems, have more and more limited space requirements. With the limited space requirements comes certain issues, such as the complexity of accessing certain areas within the chassis. For example, FIG. 1 is a perspective view showing a chassis 102 of a server computer system 100. The chassis 102 includes a conventional bracket module 104. FIG. 2 is a perspective view showing the conventional bracket module 104 in relation to devices 106 that are inserted within the conventional bracket module 104. Specifically, the conventional bracket module 104 includes slots 110 within which the devices 106 are inserted. The devices 106 can be various different devices that are inserted into the computer system 100. According to some implementations, the devices 106 are ruler devices. The conventional bracket module 104 includes a printed circuit board 112 that includes interfaces 114. The devices 106 can connect to the interfaces 114 for connecting generally to the computer system 100. The conventional bracket module 104 imposes certain limitations in accessing areas within the chassis 102, particularly areas below the conventional bracket module 104.

As shown in FIG. 3, which is a side cross-sectional view showing the inside of the chassis 102 of the computer system 100, the conventional bracket module 104 may be positioned within the chassis 102 in a configuration that leaves an area 116 below the conventional bracket module 104. Thus, the conventional bracket module 104 may prevent or limit access to the area 116. To gain access to the area 116, the conventional bracket module 104 must be removed from the chassis 102, which can be a time and labor intensive process.

Thus, there is a need for a bracket module that solves these and other problems, along with a chassis for computer systems that includes such a bracket module.

SUMMARY OF THE INVENTION

The term embodiment and like terms, e.g., implementation, configuration, aspect, example, and option, are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings, and each claim.

According to certain aspects of the present disclosure, a bracket module for a computing device is disclosed. The bracket module includes a housing structure having a plurality of slots. Each slot is configured to accept a device inserted therein. The housing structure is configured for attachment in a chassis of the computing device. The bracket module further includes a tray structure having a fixed end connected to the housing structure and a free end opposite from the fixed end. The tray structure is configured to rotate relative to the housing structure about the fixed end. The bracket module further includes at least one fastener configured to engage the tray structure with the housing structure in an open position.

According to certain further aspects, the at least one fastener is on the tray structure. The at least one fastener includes a latch that overrides the housing structure and fits into and engages a latch aperture on the housing structure. The latch is configured to hold the tray structure in the open position relative to the housing structure. According to certain further aspects, the tray structure includes a printed circuit board with a plurality of interfaces. Each interface is configured to connect to a device of the plurality of devices. According to certain further aspects, the bracket module includes at least one support structure extending from the housing structure. The at least one support structure is configured to abut the tray structure for limiting the tray structure from rotating past a closed position relative to the housing structure. The tray structure is generally planar with the housing structure in the closed position. The tray structure is generally perpendicular with the housing structure in the open position. According to certain further aspects, the tray structure includes a plurality of tray apertures. According to certain further aspects, the housing structure and the tray structure at the fixed end form a joint. The bracket module further includes a rod that extends through the joint and the fixed end to form a hinge. The bracket module further includes a pair of retainers on opposite sides of the rod. The pair of retainers retain the rod within the joint. The housing structure can include a pair of flanges that extend from the housing structure on opposite sides of the rod. The pair of retainers are coupled to the pair of flanges. The pair of retainers also can be elastomeric elements.

According to certain aspects of the present disclosure, a computing device is disclosed. The computing device includes a chassis having a base panel and two opposing side panels. The computing device further includes a bracket module coupled to the two opposing side panels above the base panel such that a working space is defined between the bracket module and the base panel. The bracket module includes a housing structure including a plurality of slots. Each slot is configured to accept a device inserted therein. The bracket module further includes a tray structure rotatably coupled to the housing structure. The tray structure is rotatable relative to the housing structure between an open position and a closed position. The working space is accessible when the tray structure is in the open position and is inaccessible when the tray structure is in the closed position.

According to certain further aspects, the at least one fastener is on the tray structure. The at least one fastener includes a latch that overrides the housing structure and fits into and engages a latch aperture on the housing structure. The latch is configured to hold the tray structure in the open position relative to the housing structure. According to certain further aspects, the tray structure includes a printed circuit board with a plurality of interfaces. Each interface is configured to connect to a device of the plurality of devices. According to certain further aspects, the bracket module further includes at least one support structure extending from the housing structure. The at least one support structure is configured to abut the tray structure for limiting the tray structure from rotating past a closed position relative to the housing structure. The tray structure is generally planar with the housing structure in the closed position. The tray structure is generally perpendicular with the housing structure in the open position. According to certain further aspects, the chassis includes a plurality of chassis apertures. The bracket module further includes a plurality of tray apertures through the tray structure. Each tray aperture of the plurality of tray apertures aligns with a chassis aperture of the plurality of chassis apertures. The computing device further includes a plurality of fasteners. Each fastener of the plurality of fasteners is configured to extend through a tray aperture of the plurality of tray apertures and engage with a chassis aperture of the plurality of chassis apertures to maintain the tray structure in a closed position, limiting access to the working space. According to certain further aspects, the housing structure and the tray structure at the fixed end form a joint. The bracket module further includes a rod that extends through the joint and the fixed end to form a hinge. The bracket module further includes a pair of retainers on opposite sides of the rod. The pair of retainers retain the rod within the joint. The housing structure includes a pair of flanges that extend from the housing structure on opposite sides of the rod. The pair of retainers are coupled to the pair of flanges. The pair of retainers also can be elastomeric elements.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of representative embodiments together with reference to the accompanying drawings. These drawings depict only representative embodiments, and are therefore not to be considered as limitations on the scope of the various embodiments or claims.

FIG. 6A is another perspective view showing the bracket module of FIG. 4, according to certain aspects of the present disclosure.

FIG. 6B is a perspective view showing a detailed portion of FIG. 6A, according to certain aspects of the present disclosure.

FIG. 7A is a perspective view showing the bracket module of FIG. 4 in a rotated configuration, also referred to as an open position, according to certain aspects of the present disclosure.

FIG. 7B is a perspective view showing a detailed portion of FIG. 7A, according to certain aspects of the present disclosure.

FIG. 7C is a perspective view showing a detailed portion of FIG. 7A, according to certain aspects of the present disclosure.

FIG. 11A is a perspective view showing the bracket module of FIG. 4, according to certain aspects of the present disclosure.

FIG. 11B is a perspective view showing a detailed portion of FIG. 11A, according to certain aspects of the present disclosure.

DETAILED DESCRIPTION

Figure 1:
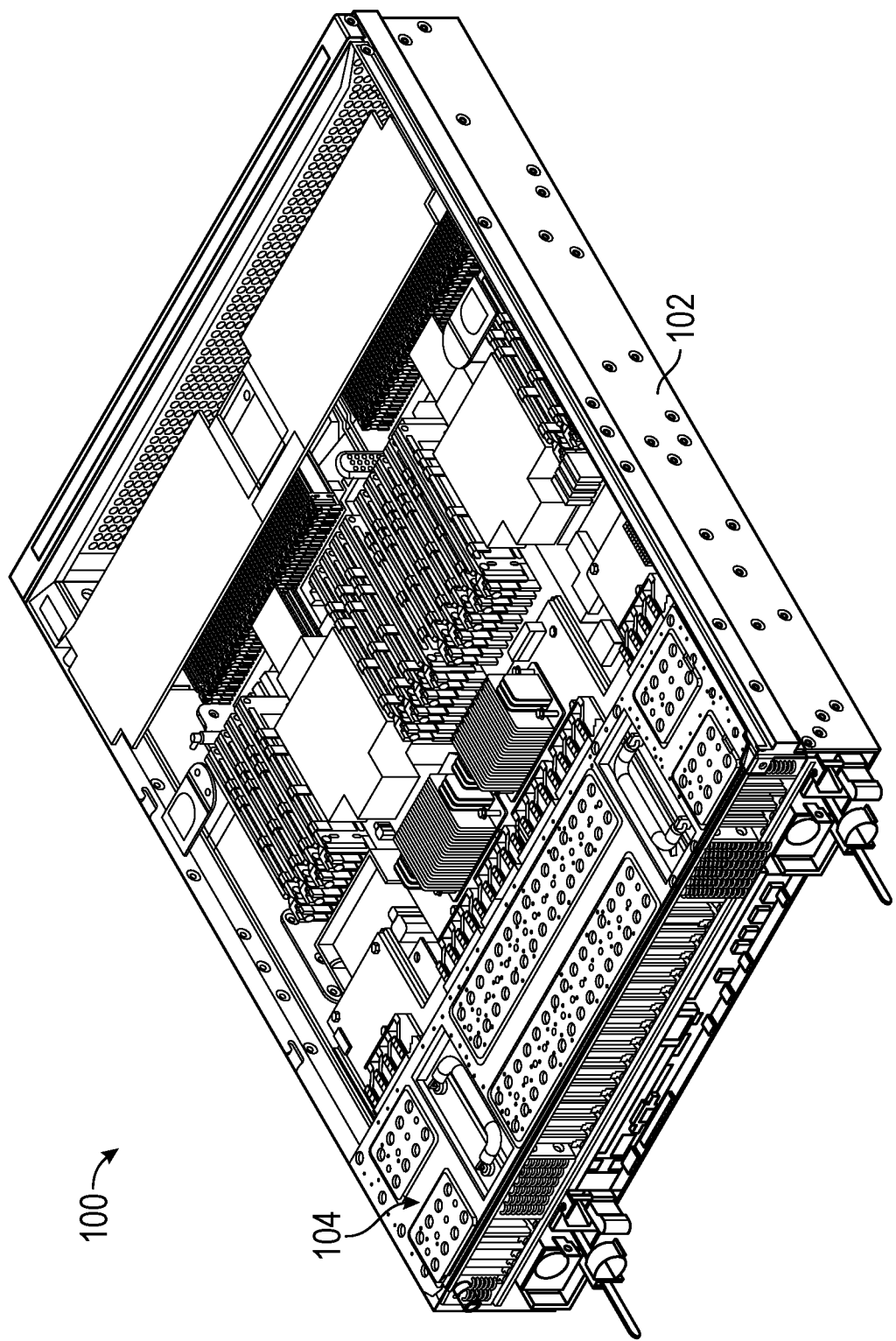
FIG. 1 is a perspective view showing a computing device.

The present disclosure describes a bracket module, and a computing device with a bracket module, that provides access to working spaces within a computing device based on a tray structure that rotates out of the way. Specifically, a user can access working spaces below the bracket module within the computing device simply by rotating the tray structure of the bracket module out of the way, rather than having to remove the entire bracket module as is currently needed with conventional bracket modules.

Various embodiments are described with reference to the attached figures, where like reference numerals are used throughout the figures to designate similar or equivalent elements. The figures are not necessarily drawn to scale and are provided merely to illustrate aspects and features of the present disclosure. Numerous specific details, relationships, and methods are set forth to provide a full understanding of certain aspects and features of the present disclosure, although one having ordinary skill in the relevant art will recognize that these aspects and features can be practiced without one or more of the specific details, with other relationships, or with other methods. In some instances, well-known structures or operations are not shown in detail for illustrative purposes. The various embodiments disclosed herein are not necessarily limited by the illustrated ordering of acts or events, as some acts may occur in different orders and/or concurrently with other acts or events. Furthermore, not all illustrated acts or events are necessarily required to implement certain aspects and features of the present disclosure.

For purposes of the present detailed description, unless specifically disclaimed, and where appropriate, the singular includes the plural and vice versa. The word "including" means "including without limitation." Moreover, words of approximation, such as "about," "almost," "substantially," "approximately," and the like, can be used herein to mean "at," "near," "nearly at," "within 3-5% of," "within acceptable manufacturing tolerances of," or any logical combination thereof. Similarly, terms "vertical" or "horizontal" are intended to additionally include "within 3-5% of" a vertical or horizontal orientation, respectively. Additionally, words of direction, such as "top," "bottom," "left," "right," "above," and "below" are intended to relate to the equivalent direction as depicted in a reference illustration; as understood contextually from the object(s) or element(s) being referenced, such as from a commonly used position for the object(s) or element(s); or as otherwise described herein.

Figure 2:
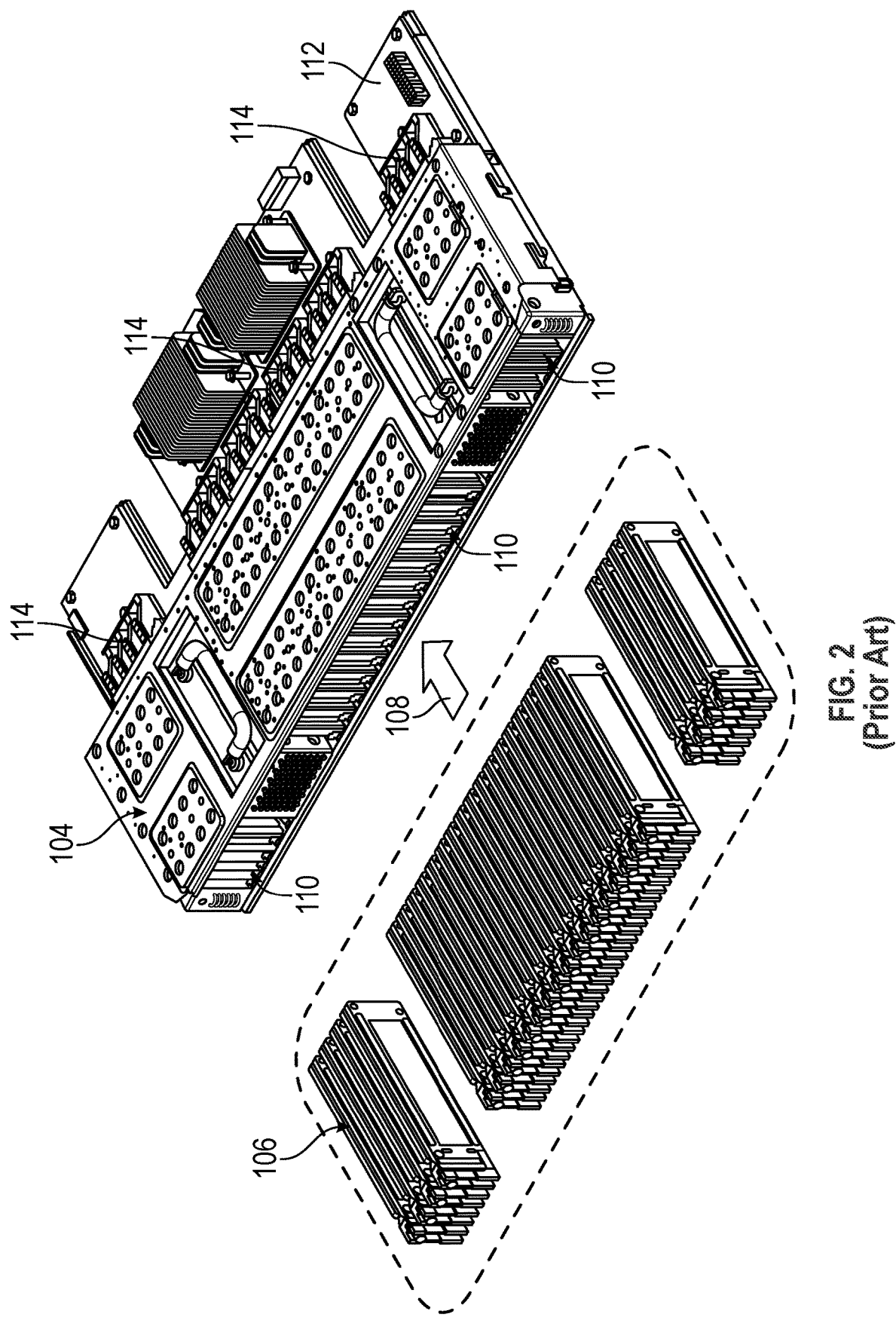
FIG. 2 is a perspective view showing a conventional bracket module with ruler devices.
Figure 4:
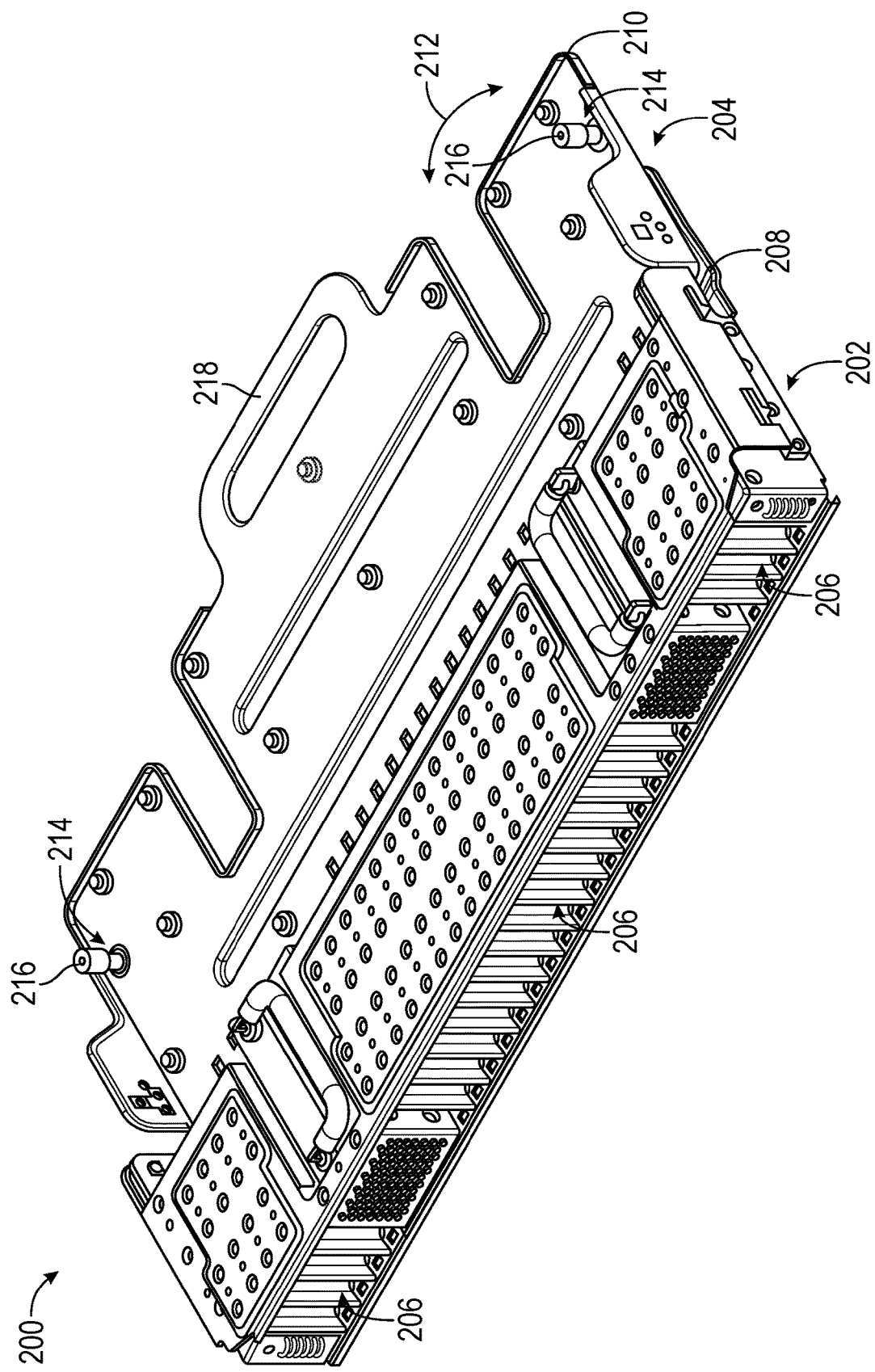
FIG. 4 is a perspective view showing a bracket module, according to certain aspects of the present disclosure.

FIG. 4 is a perspective view showing a bracket module 200, according to certain aspects of the present disclosure. The bracket module 200 includes a housing structure 202 and a tray structure 204. The housing structure 202 includes a plurality of slots 206, similar to the slots 110 discussed above in FIG. 2. The tray structure 204 is connected to the housing structure 202 at a fixed end 208. The tray structure 204 further includes a free end 210 generally opposite from the fixed end 208. The bracket module 200 being formed generally of the housing structure 202 and the tray structure 204 allows the tray structure 204 to rotate relative to the housing structure 202 generally in the direction of arrow 212. As discussed further below, the tray structure 204 can rotate to provide access to below the tray structure 204 with the bracket module 200 within a chassis of a computing device. Therefore, the entire bracket module 200 does not need to be removed from the chassis to gain access to at least a portion of the chassis below the bracket module 200.

According to some implementations, the tray structure 204 can include one or more tray apertures 214. Each one of the tray apertures 214 is configured to accept a fastener 216. In FIG. 4, the fasteners 216 are illustrated as thumb screws, which allow for a user to loosen and tighten the fasteners 216 without a tool. However, the fasteners 216 can be various types of other fasteners other than a thumb screw, such as a machine screw, a bolt, etc. As discussed further with respect to FIGS. 13-16 below, the tray apertures 214 align with corresponding chassis apertures within a chassis that contains the bracket module 200. The fasteners 216 can extend through the tray apertures 214 to engage the chassis apertures within the chassis to secure the tray structure 204 to the chassis. With the tray structure 204 secured to the chassis, the tray structure 204 cannot be rotated relative to the housing structure 202. Thus, the tray structure 204 can be maintained in the closed position, as shown in FIG. 4.

According to some implementations, the tray structure 204 can include a handle 218. The handle 218 provides an area on the tray structure 204 for a user to grasp when carrying the bracket module 200, prior to the bracket module 200 being inserted into a computing device. The handle 218 also provides an area on the tray structure 204 for the user to grasp when rotating the tray structure 204 in the direction of arrow 212 between the open and closed positions, as further described below.

Figure 5:
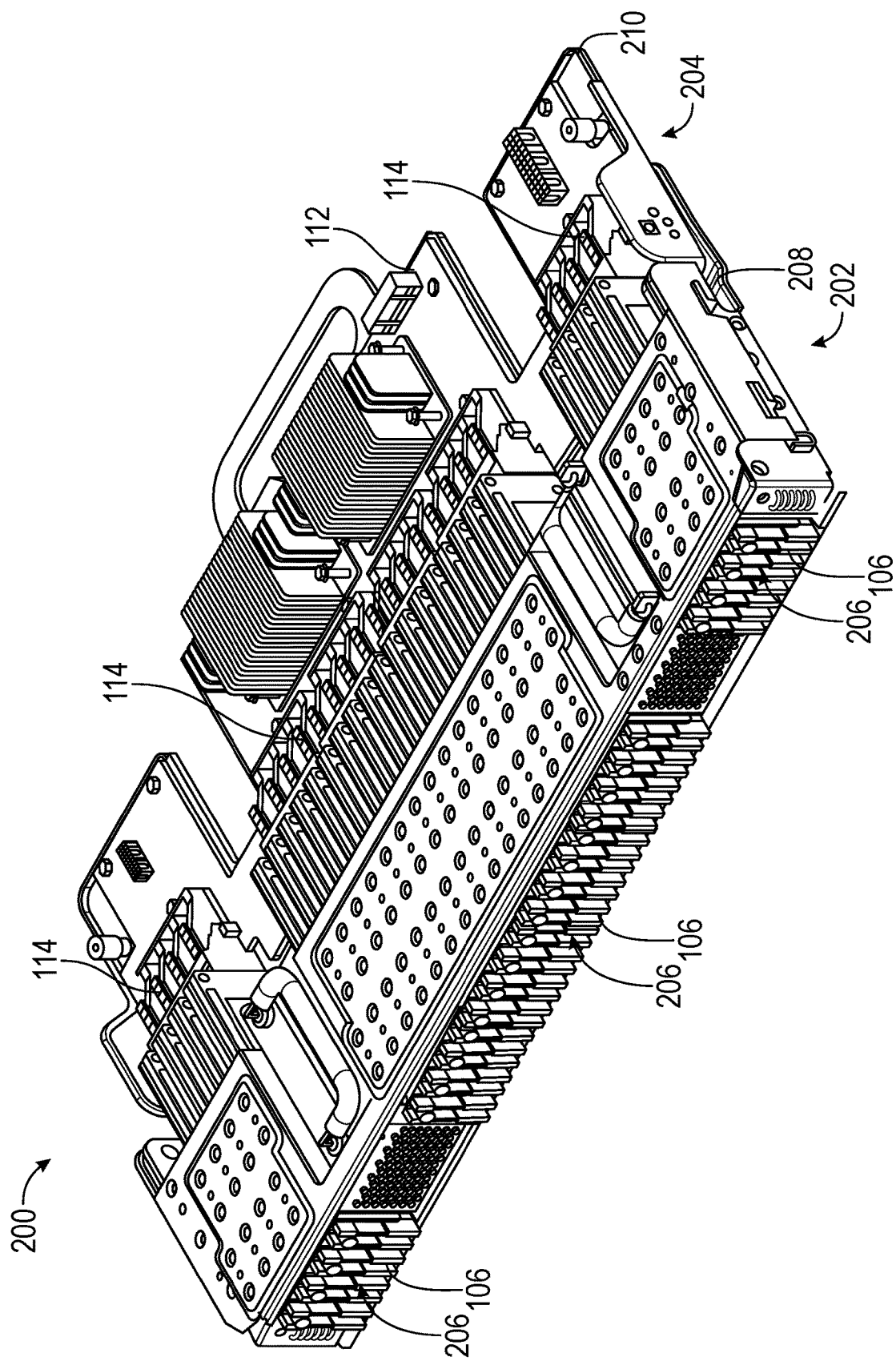
FIG. 5 is a perspective view showing the bracket module of FIG. 4 with devices therein and thereon, according to certain aspects of the present disclosure.

FIG. 5 is a perspective view showing the bracket module 200 of FIG. 4 with the devices 106, according to certain aspects of the present disclosure. The tray structure 204 is shown in FIG. 5 in the closed position. In the closed position, the devices 106 discussed above with respect to FIG. 2 can be inserted into the bracket module 200, and more specifically through the slots 206 of the housing structure 202. FIG. 5 also shows the printed circuit board 112 of FIG. 2 attached to the tray structure 204. The printed circuit board 112 includes the interfaces 114. Thus, with the tray structure 204 in the closed position, the bracket module 200 generally functions the same as a the conventional bracket module 104 of FIGS. 1-3 by accepting the devices 106.

FIG. 6A is another perspective view showing the bracket module 200 of FIG. 4, according to certain aspects of the present disclosure. FIG. 6B is a perspective view showing a detailed portion of FIG. 6A, according to certain aspects of the present disclosure. The housing structure 202 or the tray structure 204 or both, as in the case of FIGS. 6A and 6B, can include fasteners 600. Each one of the fasteners 600 is configured to engage the tray structure 204 with the housing structure 202 to maintain the tray structure 204 in an open position. More specifically, and referring to FIGS. 7A-7C, shown are views of the function of the fasteners 600 of the bracket module 200, according to certain aspects of the present disclosure. FIGS. 7B and 7C are detailed perspective views of portions of the bracket module 200 shown in FIG. 7A. As shown in FIG. 7A, the tray structure 204 is rotated relative to the housing structure 202 into the open position. In the open position, the tray structure 204 is generally perpendicular to the housing structure 202. To maintain the tray structure 204 in the open position, the fasteners 600 engage the tray structure 204 with the housing structure 202. Specifically, and referring to FIG. 7B, the fastener 600a is affixed to the housing structure 202 and is in the form of a latch. The latch includes a fixed end 702a, that is attached to the housing structure 202, and a free end 704a. The free end 704a of the fastener 600a rides over the tray structure 204 and engages a latch aperture 706b of the tray structure 204. Similarly, and referring to FIG. 7C, the fastener 600b is affixed to the tray structure 204 and also is in the form of a latch. The latch includes a fixed end 702b, that is attached to the tray structure 204, and a free end 704b. The free end 704b of the fastener 600b rides over the housing structure 202 and engages a latch aperture 706a of the tray structure 204. The foregoing operation of the fasteners 600a and 600b maintains the tray structure 204 in the open position relative to the housing structure 202. To disengage the fasteners 600a and 600b, a user simply needs to apply enough pressure so that the free ends 704a and 704b of the fasteners 600a and 600b are removed from the latch apertures 706a and 706b, respectively.

Although both sides of the housing structure 202 and the tray structure 204 are shown as including fasteners 600a and 600b, only one side of the housing structure 202 and the tray structure 204 can include the fasteners 600a and 600b. Further, although both the housing structure 202 and the tray structure 204 are shown as including fasteners 600a and 600b, only one of the housing structure 202 and the tray structure 204 may include the fastener 600a or 600b. For example, the housing structure 202 may include a fastener 600a on one side of the bracket module 200, and the tray structure 204 may include a fastener 600b on the other side of the bracket module 200, with the requisite latch apertures 706a and 706b on the housing structure 202 and the tray structure 204, respectively. Further, although the fasteners 600a and 600b are shown in FIGS. 7A-7C in the form of latches, the fasteners 600a and 600b can take various other configurations.

Figure 8A:
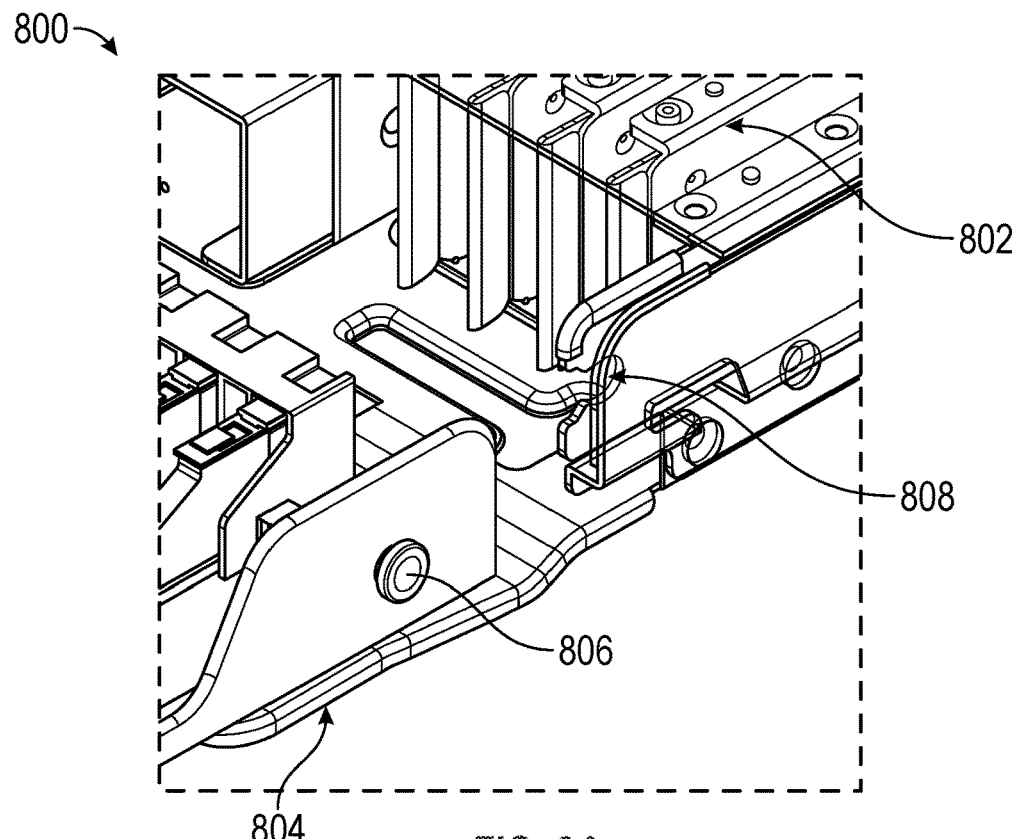
FIG. 8A is a perspective view showing a detailed portion of a bracket module, according to certain aspects of the present disclosure.
Figure 8B:
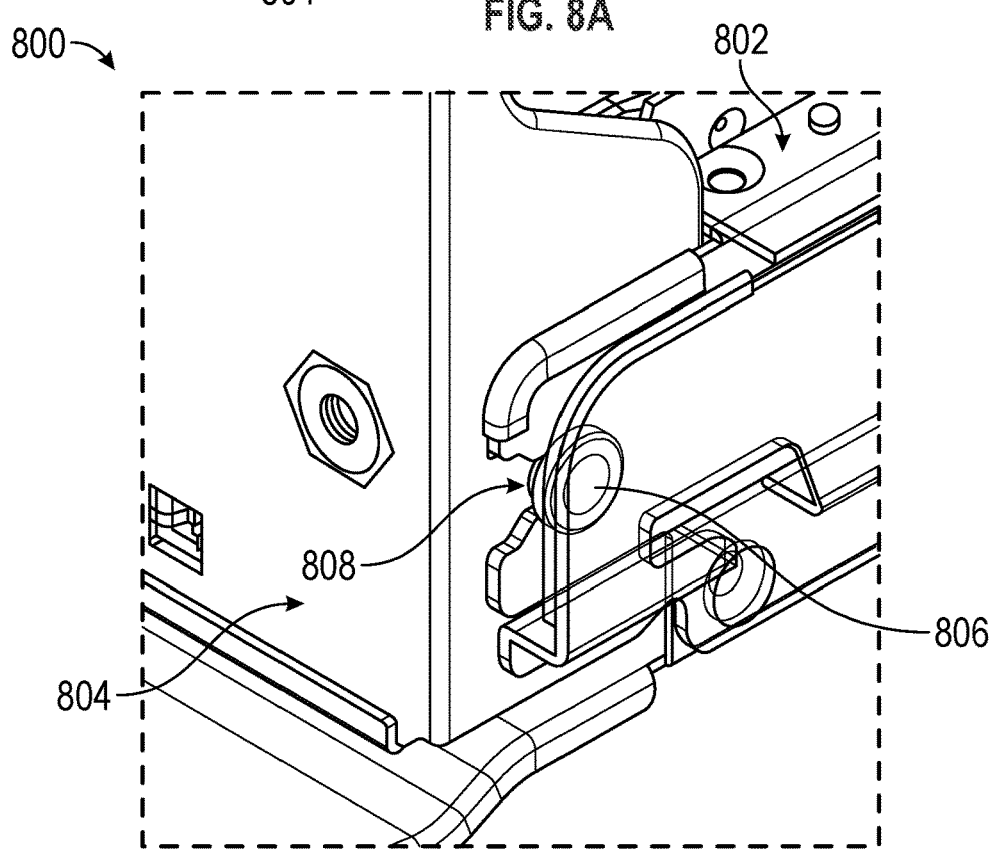
FIG. 8B is another perspective view showing a detailed portion of a bracket module of FIG. 8A, according to certain aspects of the present disclosure.

For example, FIGS. 8A and 8B show an alternative arrangement for fasteners. Specifically, FIGS. 8A and 8B show a bracket module 800 with a housing structure 802 and a tray structure 804, which are identical to the bracket module 200, the housing structure 202, and tray structure 204 disclosed above except for the following difference. Instead of the fasteners 600 (FIG. 6B), the tray structure 804 includes a post 806 and the housing structure 802 includes a notch 808. The post 806 forms an interference fit with the notch 808 when the tray structure 804 is rotated into the open position relative to the housing structure 802, as shown in FIG. 8B. The interference fit keeps the tray structure 804 in the open position.

Although the post 806 is shown and described as being on the tray structure 804, the post 806 can alternatively be on the housing structure 802. In which case, the notch 808 can instead be on the tray structure 804. Further, the post 806 and the notch 808 are shown in FIGS. 8A and 8B as being on one side of the bracket module 800. However, a post 806 and a notch 808 can also be on the opposite side of the bracket module 800.

Figure 9:
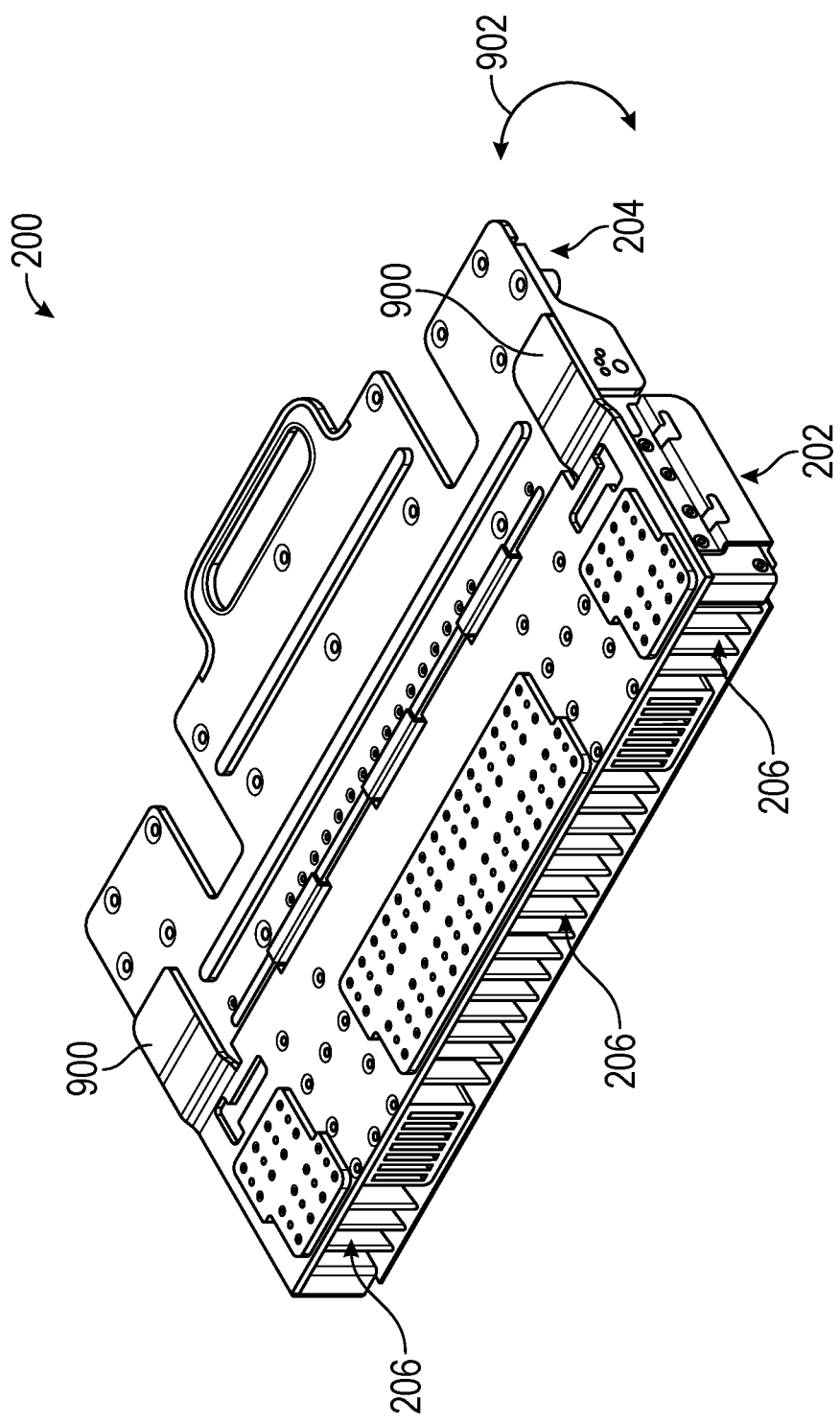
FIG. 9 is a perspective view showing the underside of the bracket module of FIG. 4, according to certain aspects of the present disclosure.
Figure 10:
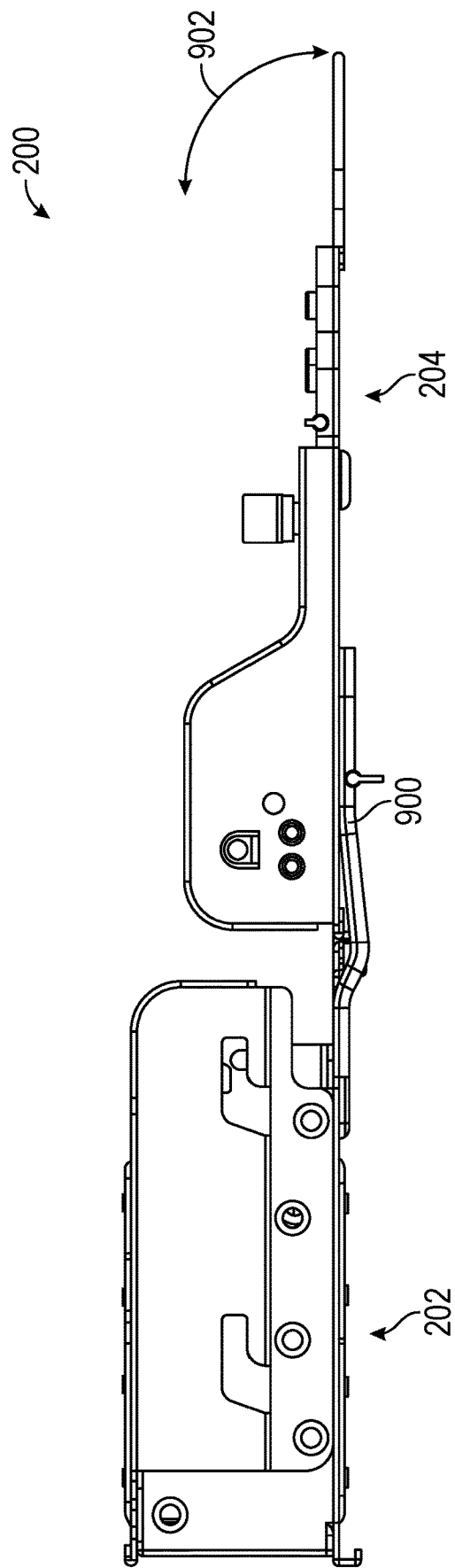
FIG. 10 is a side view showing the bracket module of FIG. 4, according to certain aspects of the present disclosure.

FIG. 9 is a perspective view showing the underside of the bracket module 200 of FIG. 4, according to certain aspects of the present disclosure. According to some implementations, the housing structure 202 further includes support structures 900. The support structures 900 can be integral with the housing structure 202 or be coupled to the housing structure 202. The support structures 900 extend from the housing structure 202 to below the tray structure 204. The support structures 900 are configured to abut the tray structure 204 for limiting the tray structure 204 from rotating in the direction of arrow 902 beyond a closed position, as shown in FIG. 9, relative to the housing structure 202. Thus, and referring to FIG. 10, the support structures 900 limit the tray structure 204 from rotating clockwise generally beyond the planar arrangement with the housing structure 202 in the closed position. Although two support structures 900 are shown in FIG. 9, the bracket module 200 can include any number of support structures 900, such as one, two, three, four, five, etc.

FIG. 11A is a perspective view showing the bracket module 200 of FIG. 4, according to certain aspects of the present disclosure. FIG. 11B is a perspective view showing a detailed portion of FIG. 11A, according to certain aspects of the present disclosure. The fixed end 208 of the tray structure 204 and the housing structure 202 generally form a joint 1100 about which the tray structure 204 is configured to rotate. A rod 1102 (FIG. 11A) extends through the joint 1100 in the direction of arrow 1104 to form a hinge. The rod 1102 maintains the fixed end 208 of the tray structure 204 engaged with the housing structure 202.

Figure 12B:
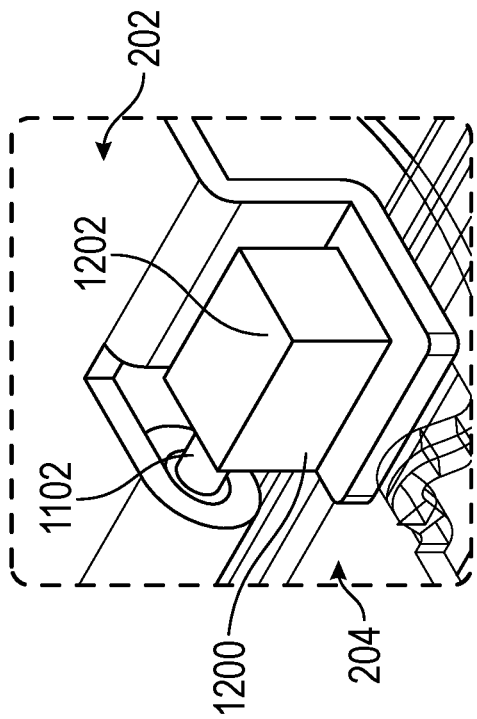
FIG. 12B is a perspective view showing a detailed portion of FIG. 12A, according to certain aspects of the present disclosure.
Figure 12A:
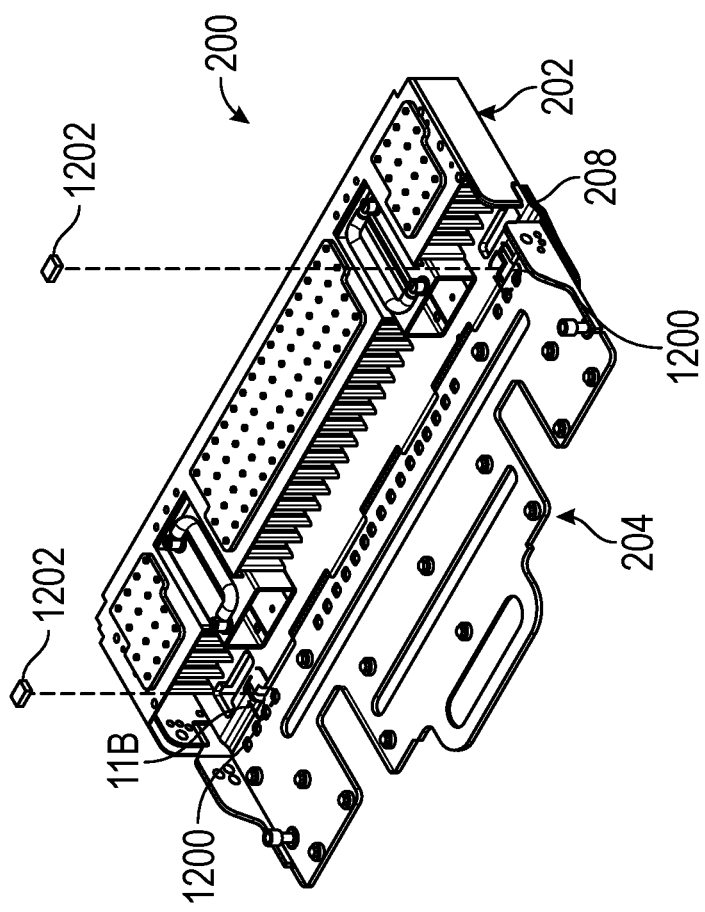
FIG. 12A is a perspective view showing the bracket module of FIG. 4, according to certain aspects of the present disclosure.

According to some implementations, the rod 1102 can be affixed to the housing structure 202 or the tray structure 204 to maintain the rod 1102 within the joint 1100, such as the rod 1102 being welded tor adhered. Alternatively, and referring to FIGS. 12A and 12B, the housing structure 202 can include a pair of flanges 1200 (FIG. 12B). The flanges 1200 extend from the housing structure 202 on opposite sides of where the rod 1102 (FIG. 11A) is seated when the rod 1102 is within the joint 1100. Each flange 1200 supports a retainer 1202 (shown in an exploded view in FIG. 12A) that sits on and/or is coupled to the flange 1200. According to some implementations, the retainers 1202 can be elastomeric elements. The retainers 1202 prevent or limit the rod 1102 from escaping from the joint 1100.

Figure 3:
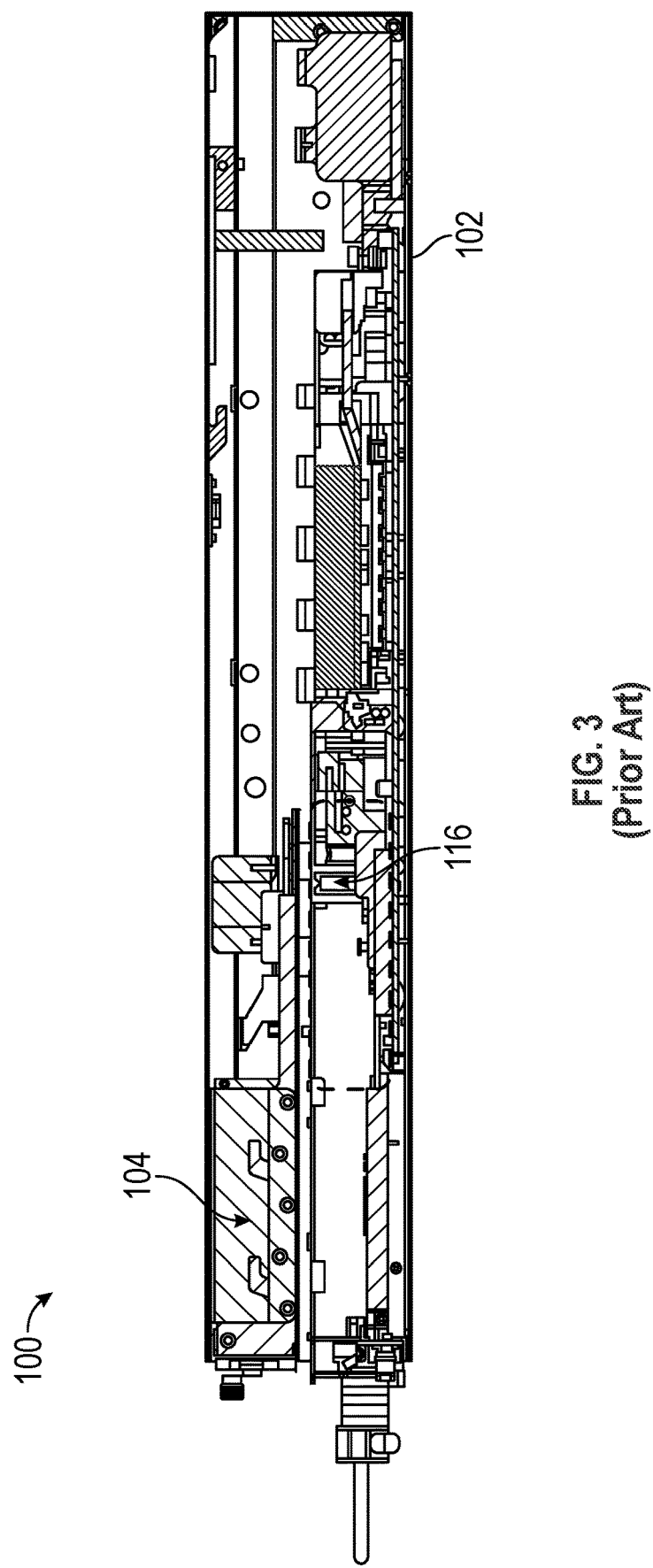
FIG. 3 is a side cross-sectional side view showing the inside of the chassis of FIG. 1.
Figure 13:
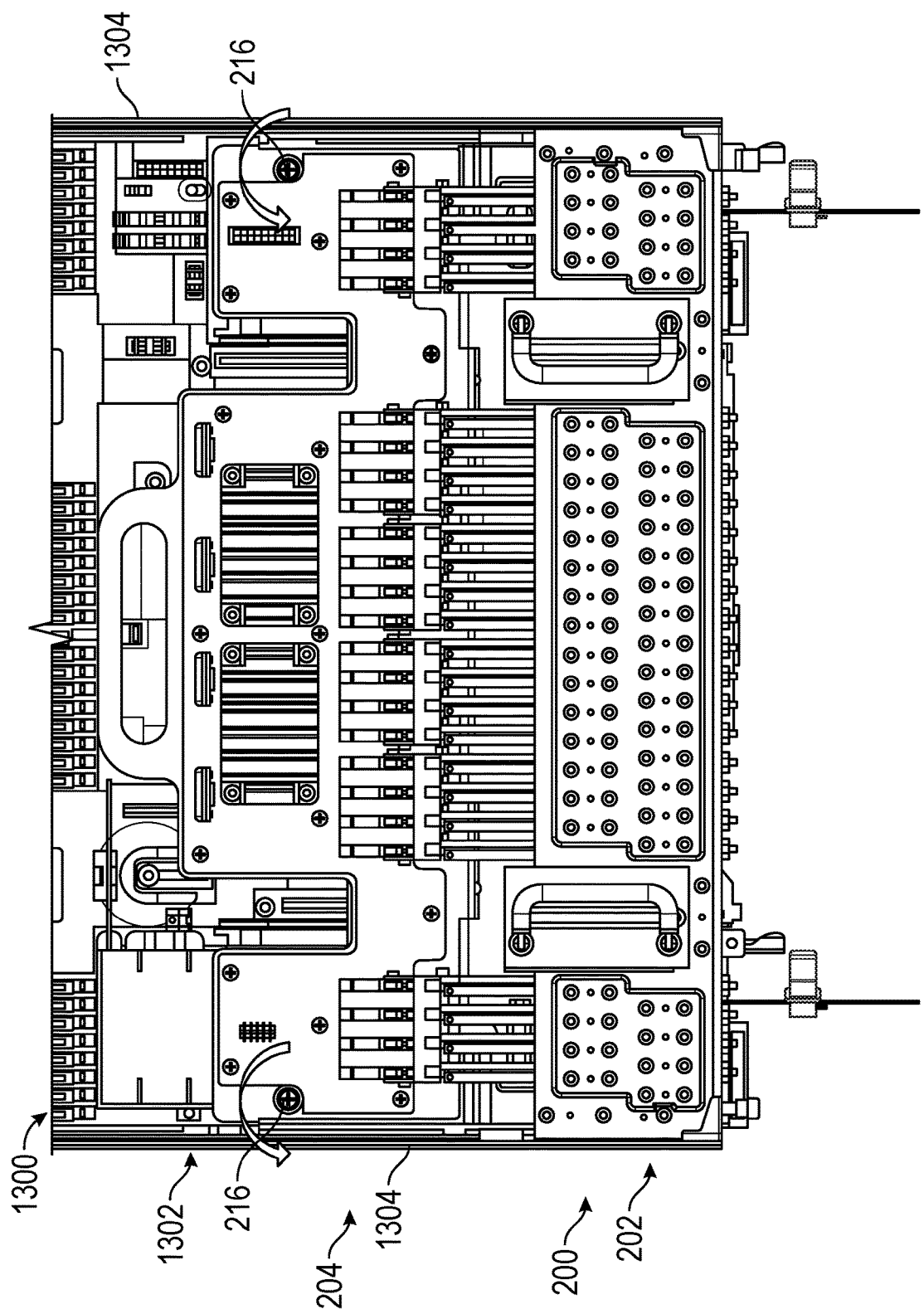
FIG. 13 is a top view showing use of a bracket module within a chassis, according to certain aspects of the present disclosure.

FIGS. 13-16 show the steps involved in accessing portions of a chassis 1302 of a computing device 1300 based on the advantages of the bracket module 200, according to certain aspects of the present disclosure. Specifically, FIG. 13 shows the computing device 1300 with the chassis 1302, which includes two generally parallel and opposing side panels 1304. The bracket module 200, as discussed above, is coupled to the two opposing side panels 1304, similar to the conventional bracket module 104, as shown in FIG. 3. As a result, area working space is defined below the bracket module 200 within the chassis 1302, as further described below. To access the working space, one of the first steps is to loosen the fasteners 216 that secure the tray structure 204 of the bracket module 200 to the chassis 1302, if the fasteners 216 are present.

Figure 14:
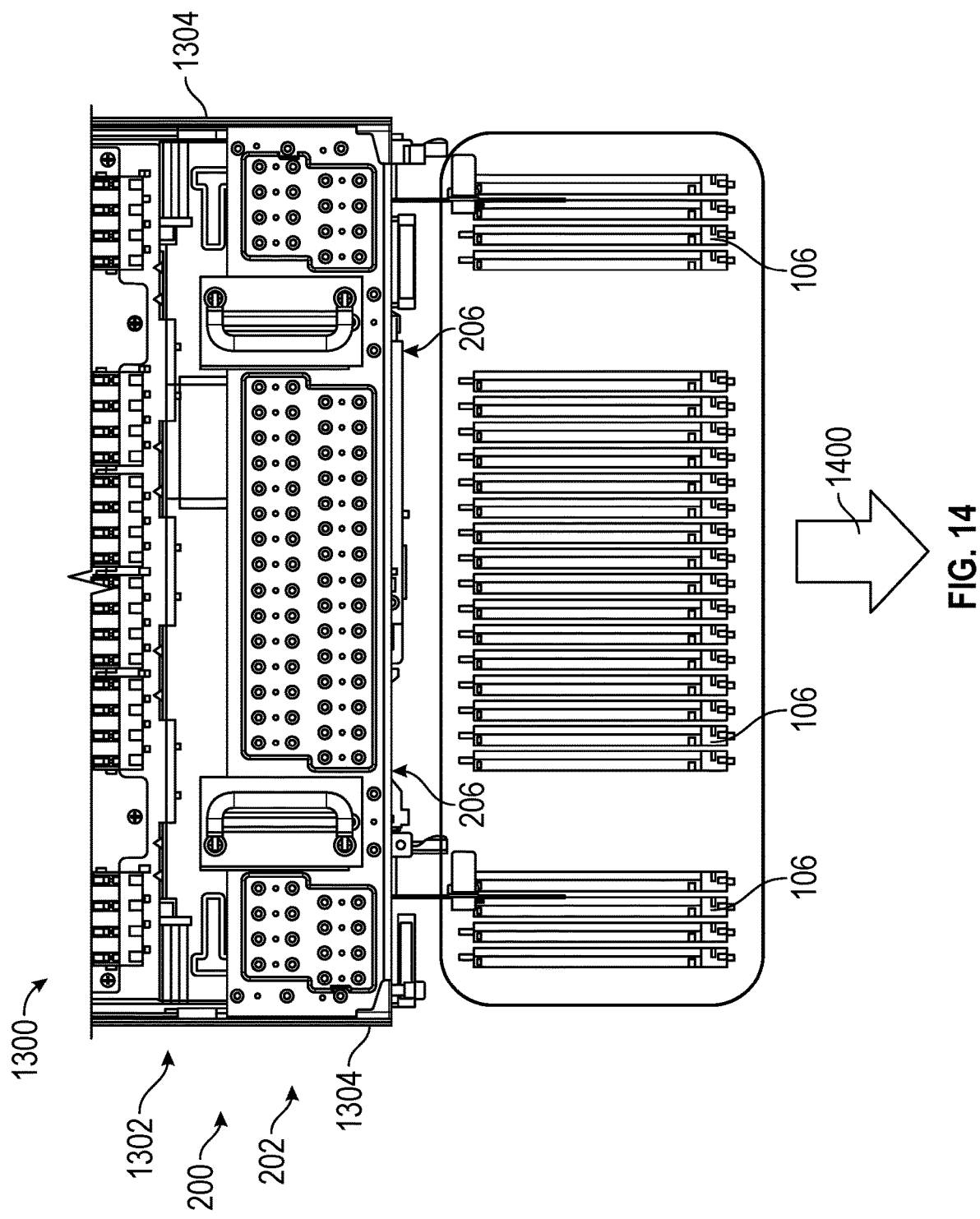
FIG. 14 is a top view showing removal of devices from the bracket module of FIG. 13, according to certain aspects of the present disclosure.

Next, and referring to FIG. 14, the devices 106 are withdrawn from the slots 206 of the housing structure 202 in the direction of arrow 1400. The devices 106 must be withdrawn because the devices 106 are long enough to extend over the tray structure 204 and, therefore, interfere with the tray structure 204 rotating.

Figure 15:
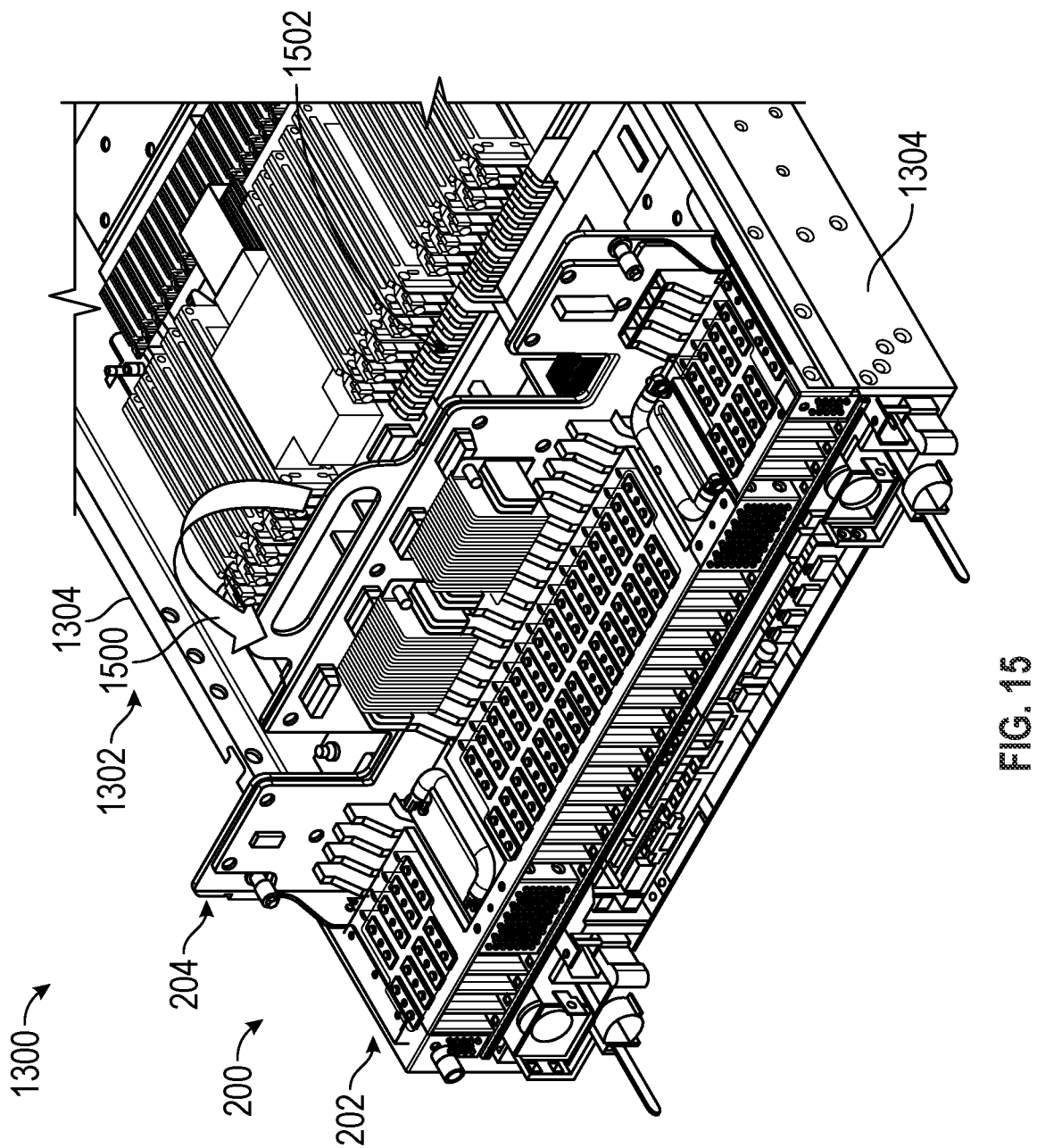
FIG. 15 is a perspective showing the bracket module in an open position, according to certain aspects of the present disclosure.
Figure 16:
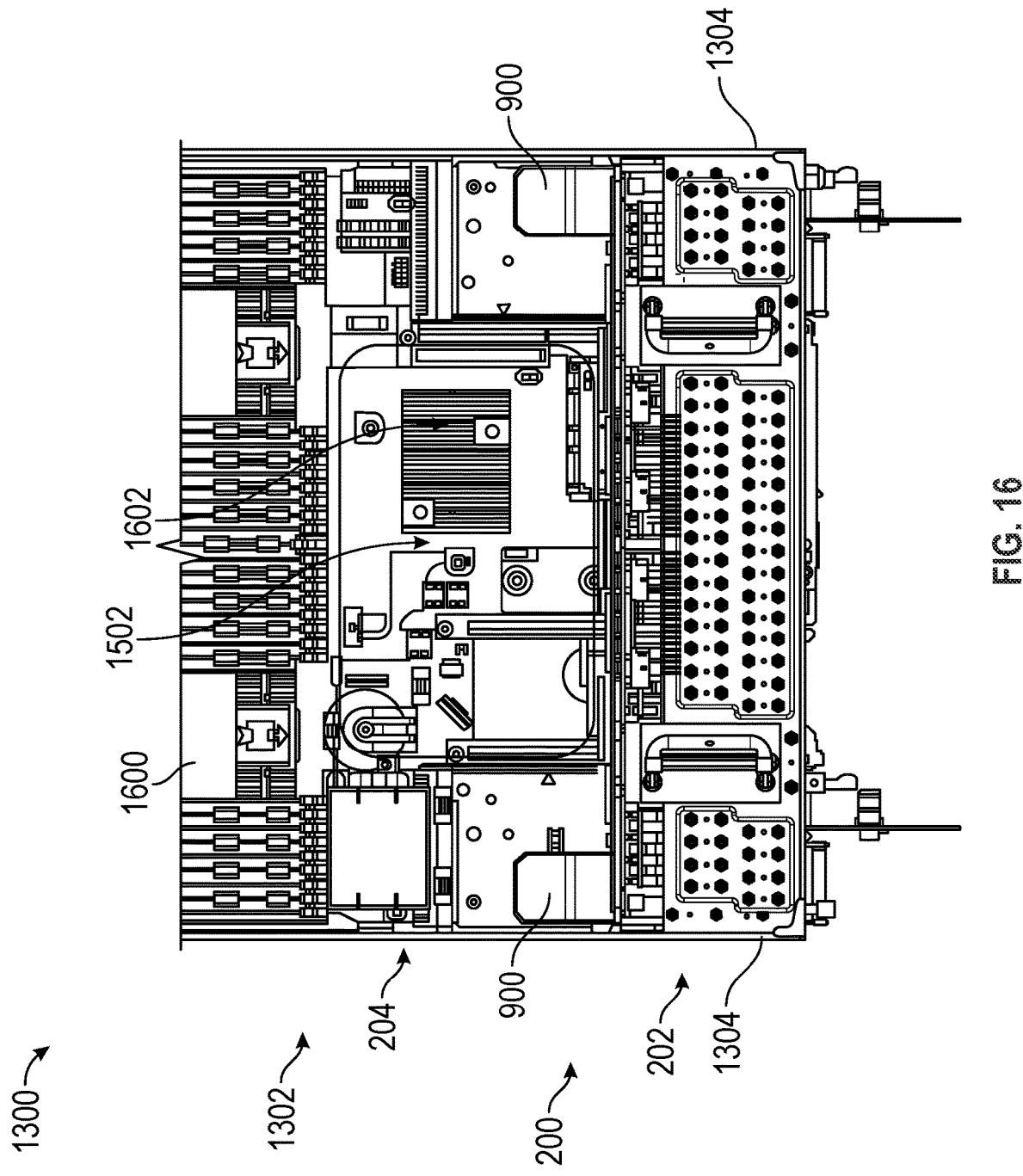
FIG. 16 is a top view showing working space below the bracket module within the chassis, according to certain aspects of the present disclosure.

Next, and referring to FIG. 15, which shows a perspective view of the computing device 1300, the tray structure 204 is rotated in the direction of arrow 1500 into the open position. Further, FIG. 16 shows a top view of the tray structure 204 in the open position. The tray structure 204 in the open position provides access to the working space 1502 of the chassis 1302 below the tray structure 204. The working space 1502 may include the base panel 1600 (FIG. 16) of the chassis 1302 or one or more components 1602 (FIG. 16) connected to the base panel 1600, such as one or more processors, one or more memory devices, a printed circuit board (e.g., a motherboard or a daughterboard), etc. Thus, a user that needs to access the working space 1502, for accessing the base panel 1600 or the components 1602 connected to the base panel or any other element within the working space 1502, can do so without needing to remove the entire bracket module 200 from the chassis 1302 by instead simply rotating the tray structure 204. Moreover, once the reason for accessing the working space 1502 is completed, the steps shown and described with respect to FIGS. 13-16 can be performed in reverse to put the bracket module 200 back into the operating, closed position.

Although the disclosed embodiments have been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

While various embodiments of the present disclosure have been described above, it should be understood that they have been presented by way of example only, and not limitation. Numerous changes to the disclosed embodiments can be made in accordance with the disclosure herein, without departing from the spirit or scope of the disclosure. Thus, the breadth and scope of the present disclosure should not be limited by any of the above described embodiments.

Rather, the scope of the disclosure should be defined in accordance with the following claims and their equivalents.

What is claimed is:

1. A bracket module for a computing device, the bracket module comprising:
    a housing structure including a plurality of slots and a pair of flanges, each slot being configured to accept a device inserted therein, the housing structure being configured for attachment in a chassis of the computing device;
    a tray structure including a fixed end connected to the housing structure and a free end opposite from the fixed end, the tray structure being configured to rotate relative to the housing structure about the fixed end, the housing structure and the tray structure forming a joint at the fixed end;
    at least one fastener configured to engage the tray structure with the housing structure in an open position;
    a rod that extends through the joint and the fixed end to form a hinge, the pair of flanges extending from the housing structure on opposite sides of the rod; and
    a pair of retainers on opposite sides of the rod and coupled to the pair of flangers, the pair of retainers retaining the rod within the hinge, the pair of retainer being elastomeric elements.

2. The bracket module of claim 1, wherein the at least one fastener is on the tray structure, the at least one fastener including a latch that overrides the housing structure and fits into and engages a latch aperture on the housing structure, the latch being configured to hold the tray structure in the open position relative to the housing structure.

3. The bracket module of claim 1, wherein the tray structure includes a printed circuit board with a plurality of interfaces, and each interface is configured to connect to a device of the plurality of devices.

4. The bracket module of claim 1, further comprising:
    at least one support structure extending from the housing structure, the at least one support structure being configured to abut the tray structure for limiting the tray structure from rotating past a closed position relative to the housing structure.

5. The bracket module of claim 4, wherein the tray structure is generally planar with the housing structure in the closed position, the tray structure being generally perpendicular with the housing structure in the open position.

6. The bracket module of claim 1, wherein the tray structure includes a plurality of tray apertures.

7. A computing device comprising:
    a chassis having a base panel and two opposing side panels, the chassis including a plurality of chassis apertures; and
    a bracket module coupled to the two opposing side panels above the base panel such that a working space is defined between the bracket module and the base panel, the bracket module including:
        a housing structure including a plurality of slots, each slot being configured to accept a device inserted therein;
        a tray structure rotatably coupled to the housing structure, the tray structure being rotatable relative to the housing structure between an open position and a closed position, the working space being accessible when the tray structure is in the open position, the working space being inaccessible when the tray structure is in the closed position; and
        a plurality of tray apertures through the tray structure, each tray aperture of the plurality of tray apertures aligning with a chassis aperture of the plurality of chassis apertures.

8. The computing device of claim 7, wherein the bracket module further includes at least one fastener configured to engage the tray structure with the housing structure in the open position, the at least one fastener being on the tray structure, the at least one fastener including a latch that overrides the housing structure and fits into and engages a latch aperture on the housing structure, the latch being configured to hold the tray structure in the open position relative to the housing structure.

9. The computing device of claim 7, wherein the tray structure includes a printed circuit board with a plurality of interfaces, and each interface is configured to connect to a device of the plurality of devices.

10. The computing device of claim 7, wherein the bracket module further comprises at least one support structure extending from the housing structure, the at least one support structure being configured to abut the tray structure for limiting the tray structure from rotating past the closed position relative to the housing structure.

11. The computing device of claim 7, wherein the tray structure is generally planar with the housing structure in the closed position, the tray structure being generally perpendicular with the housing structure in the open position.

12. The computing device of claim 7, further comprising a plurality of fasteners, each fastener of the plurality of fasteners being configured to extend through a tray aperture of the plurality of tray apertures and engage with a chassis aperture of the plurality of chassis apertures to maintain the tray structure in a closed position, limiting access to the working space.

13. The computing device of claim 7, wherein the housing structure and the tray structure at the fixed end form a joint, the bracket module further including:
    a rod that extends through the joint and the fixed end to form a hinge; and
    a pair of retainers on opposite sides of the rod, the pair of retainers retaining the rod within the hinge.

14. The computing device of claim 13, wherein the housing structure includes a pair of flanges that extend from the housing structure on opposite sides of the rod, the pair of retainers being coupled to the pair of flanges.

15. The computing device of claim 14, wherein the pair of retainers are elastomeric elements.

16. A computing device comprising:
    a chassis having a base panel and two opposing side panels, the chassis including a plurality of chassis apertures; and
    a bracket module coupled to the two opposing side panels above the base panel, the bracket module including:
        a housing structure including a plurality of slots and a pair of flanges, each slot being configured to accept a device inserted therein;
        a tray structure rotatably coupled to the housing structure to form a joint, the tray structure being rotatable relative to the housing structure between an open position and a closed position;
        a plurality of tray apertures through the tray structure, each tray aperture of the plurality of tray apertures aligning with a chassis aperture of the plurality of chassis apertures; and
        a rod that extends through the joint and the fixed end to form a hinge, the pair of flanges extending from the housing structure on opposite sides of the rod.

17. The computing device of claim 16, wherein a working space is defined between the bracket module and the base panel, the working space being accessible when the tray structure is in the open position, the working space being inaccessible when the tray structure is in the closed position.

18. The computing device of claim 16, wherein the tray structure includes a printed circuit board with a plurality of interfaces, each interface being configured to connect to a device of the plurality of devices.

19. The computing device of claim 16, wherein the bracket module further comprises at least one support structure extending from the housing structure, the at least one support structure being configured to abut the tray structure for limiting the tray structure from rotating past the closed position relative to the housing structure.

20. The computing device of claim 16, wherein the tray structure is generally planar with the housing structure in the closed position, the tray structure being generally perpendicular with the housing structure in the open position.

* * * * *